United States Patent
Peterson et al.

(10) Patent No.: US 10,768,226 B2
(45) Date of Patent: *Sep. 8, 2020

(54) TESTING MECHANISM FOR A PROXIMITY FAIL PROBABILITY OF DEFECTS ACROSS INTEGRATED CHIPS

(71) Applicant: International Business Machines Corporation, Armonk, NY (US)

(72) Inventors: Kirk D. Peterson, Jericho, VT (US); Alain G. Rwabukamba, Chittenden, VT (US); Andrew A. Turner, Underhill, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 92 days.

This patent is subject to a terminal disclaimer.

(21) Appl. No.: 16/117,931

(22) Filed: Aug. 30, 2018

(65) Prior Publication Data

US 2018/0372799 A1    Dec. 27, 2018

Related U.S. Application Data (63) Continuation of application No. 15/138,906, filed on Apr. 26, 2016, now Pat. No. 10,114,071.

(51) Int. Cl.
*G01R 31/317* (2006.01)
*G01R 31/3177* (2006.01)

(52) U.S. Cl.
CPC ... *G01R 31/31703* (2013.01); *G01R 31/3177* (2013.01); *G01R 31/31707* (2013.01)

(58) Field of Classification Search
CPC ................. G01R 31/31703; G01R 31/3177
See application file for complete search history.

(56) References Cited

U.S. PATENT DOCUMENTS

| 4,812,962 A | 3/1989 | Witt |
| 5,913,105 A | 6/1999 | McIntyre et al. |
| 5,982,920 A | 11/1999 | Tobin, Jr. et al. |

(Continued)

FOREIGN PATENT DOCUMENTS

| WO | 200163309 A1 | 8/2001 |
| WO | 2008008156 A2 | 1/2008 |
| WO | 2007130000 A3 | 11/2008 |

OTHER PUBLICATIONS

List of IBM Patents or Patent Applications Treated as Related; Date Filed: Aug. 29, 2018, 2 pages.

(Continued)

*Primary Examiner* — Thien Nguyen
(74) *Attorney, Agent, or Firm* — Cantor Colburn LLP; Erik Johnson (57) ABSTRACT

According to an embodiment, a testing mechanism determines a status of circuits within a chip by analyzing fail signatures on a by-level basis to identify a high probability defect area within the chip. The testing mechanism further determines a whether functionally needed circuitry of the chip intersects with the high probability defect area within the chip and determines the status of the circuits in response to the determining of whether the functionally needed circuitry intersects with the high probability defect area.

16 Claims, 3 Drawing Sheets

(56) References Cited

U.S. PATENT DOCUMENTS

| | | | |
|---|---|---|---|
| 6,473,665 B2* | 10/2002 | Mugibayashi | H01L 22/20 |
| | | | 700/110 |
| 6,738,954 B1 | 5/2004 | Allen et al. | |
| 2002/0002415 A1 | 1/2002 | Mugibayashi et al. | |
| 2003/0140294 A1* | 7/2003 | Sagatelian | G01R 31/318342 |
| | | | 714/732 |
| 2005/0149285 A1* | 7/2005 | Wohlfahrt | G11C 29/56 |
| | | | 702/118 |
| 2006/0043998 A1 | 3/2006 | Suciu et al. | |
| 2006/0081971 A1 | 4/2006 | Shau | |
| 2006/0088998 A1 | 4/2006 | Moriya et al. | |
| 2008/0008156 A1 | 1/2008 | Keuhner | |
| 2008/0281541 A1* | 11/2008 | Singh | G01R 31/287 |
| | | | 702/81 |
| 2011/1150089 | 6/2011 | Chujoh et al. | |
| 2011/0199114 A1* | 8/2011 | Furland | G01R 31/31703 |
| | | | 324/762.06 |
| 2017/0307685 A1 | 10/2017 | Peterson et al. | |

OTHER PUBLICATIONS

Rahman et al.; "Reliability Studies of a 32nm System-on-Chip (SoC) Platform Technology with 2nd Generation High-K/Metal Gate Transistors"; IEEE; 2011; pp. 533-538.

* cited by examiner

FIG. 3

TESTING MECHANISM FOR A PROXIMITY FAIL PROBABILITY OF DEFECTS ACROSS INTEGRATED CHIPS

DOMESTIC PRIORITY

This application is a continuation of U.S. application Ser. No. 15/138,906, filed Apr. 26, 2016, the disclosure of which is incorporated by reference herein in its entirety.

BACKGROUND

The disclosure relates generally to a testing mechanism for a proximity fail probability of defects across integrated chips.

In general, conventional mechanisms that test integrated chips can find defects within the tested chips. These defects can be repaired with redundant elements or can be removed by taking an associated circuit block of the integrated chip off-line. Repair actions may cause the surrounding circuitry, which is still expected to function, to be suspect because of proximity to defects.

In addition, the conventional mechanisms that test integrated chips do not leverage fail diagnostic data to predict undetected fail locations or locations likely to fail due to reliability aging. That is, while defects can be associated with a fail prediction probability, the defects do not guarantee a fail. In turn, the conventional mechanisms only utilize high level sort level details (i.e. 'nearest neighbor' sorting) or maverick limits (i.e. excessive array repairs) to resolve defects on the integrated chips, both of which are non-optimal.

SUMMARY

According to an embodiment, a method for determining a status of circuits within a chip by a testing mechanism is provided. The method comprises analyzing, by the testing mechanism, fail signatures on a by-level basis to identify a high probability defect area within the chip; determining, by the testing mechanism, whether functionally needed circuitry of the chip intersects with the high probability defect area within the chip; and determining, by the testing mechanism, the status of the circuits in response to the determining of whether the functionally needed circuitry intersects with the high probability defect area.

According to an embodiment, a computer program product is provided. The computer program product comprises a computer readable storage medium having program instructions of a testing mechanism for determining a status of circuits within a chip embodied therewith, the program instructions executable by a processor to cause the processor to perform: analyzing fail signatures on a by-level basis to identify a high probability defect area within the chip; determining whether functionally needed circuitry of the chip intersects with the high probability defect area within the chip; and determining the status of the circuits in response to the determining of whether the functionally needed circuitry intersects with the high probability defect area.

According to an embodiment, a system is provided. The system comprising a processor and a memory storing program instructions of testing mechanism for determining a status of circuits within a chip thereon, the program instructions executable by a processor to cause the system to perform: analyzing fail signatures on a by-level basis to identify a high probability defect area within the chip; determining whether functionally needed circuitry of the chip intersects with the high probability defect area within the chip; and determining the status of the circuits in response to the determining of whether the functionally needed circuitry intersects with the high probability defect area.

Additional features and advantages are realized through the techniques of the present disclosure. Other embodiments and aspects of the disclosure are described in detail herein. For a better understanding of the disclosure with the advantages and the features, refer to the description and to the drawings.

BRIEF DESCRIPTION OF THE SEVERAL VIEWS OF THE DRAWINGS

The subject matter is particularly pointed out and distinctly claimed in the claims at the conclusion of the specification. The forgoing and other features, and advantages of the embodiments herein are apparent from the following detailed description taken in conjunction with the accompanying drawings in which:

DETAILED DESCRIPTION

The disclosure relates generally to a testing mechanism for a proximity fail probability of defects across integrated chips, and more specifically, to a testing mechanism configured to analyze fail signatures on a by-level basis for repairable or partial good circuitry to calculate fail probabilities and dispositions of nearby circuits that are still needed for operation. Thus, embodiments of the testing mechanism disclosed herein may include system, method, and/or computer program product (herein a system) that optimizes a function of circuits that are still on-line in view of the calculated fail probabilities and dispositions.

Figure 1:
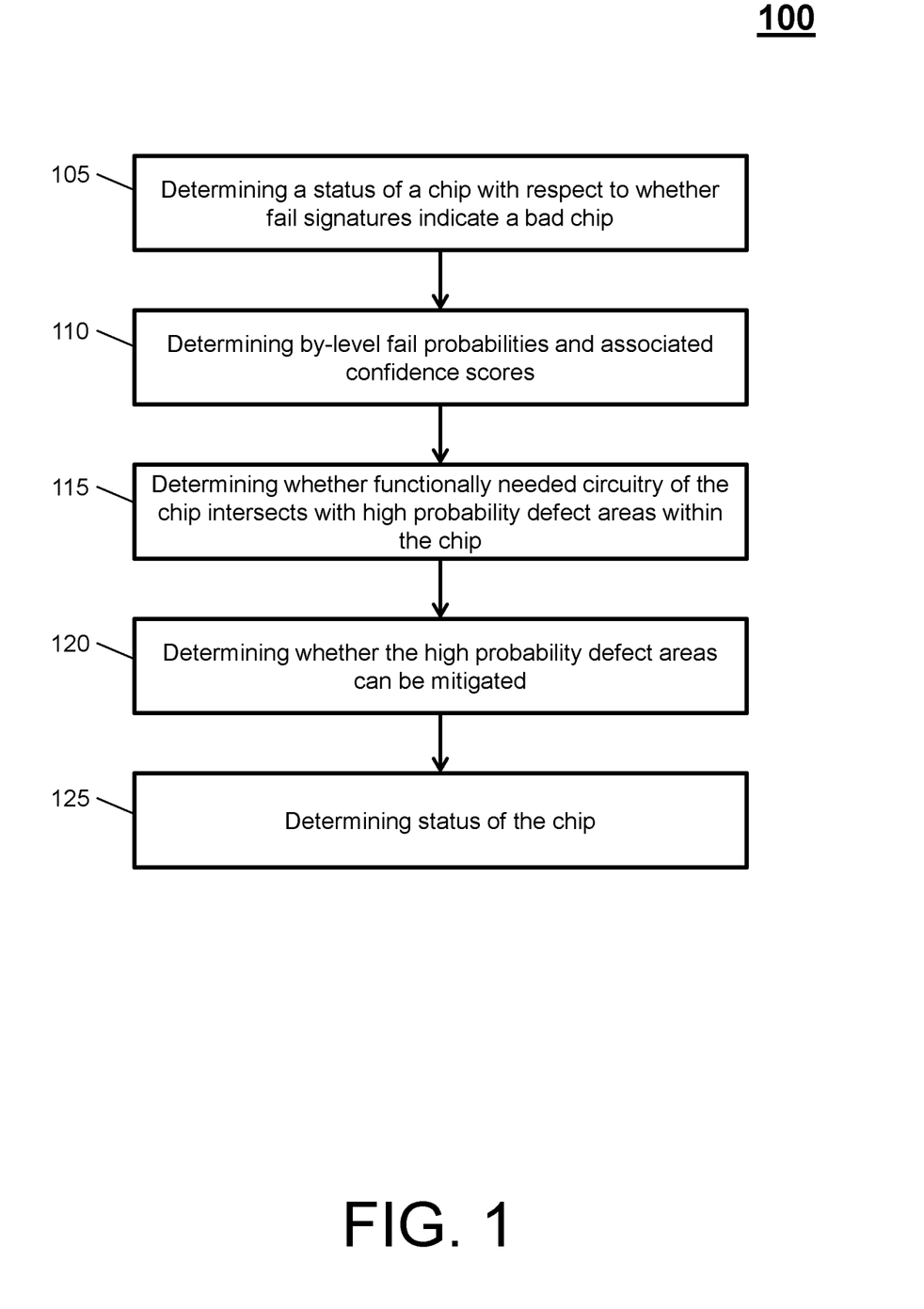
FIG. 1 illustrates a process flow of a system in accordance with an embodiment.

In an embodiment, the testing mechanism determines a status of a chip by analyzing fail signatures on a by-level basis to identify high probability defect areas within the chip; determining whether functionally needed circuitry of the chip intersects with the high probability defect areas within the chip; and determining the status of the chip in response to the determining of whether the functionally needed circuitry intersects with the high probability defect areas. Turning now to FIG. 1, a process flow 100 is generally shown in accordance with this embodiment.

The process flow 100 can be implemented by the testing mechanism. In general, the testing mechanism can be a software, hardware, or combination thereof. For example, the testing mechanism can be firmware stored on a memory of a discrete computing system that interfaces with an integrated circuit. The discrete computing system (e.g., the processing system 300 of FIG. 3) can utilize a processor to execute the firmware, which during executing causes the discrete computing system to perform the process flow 100 with respect to a chip.

The chip can be any integrated circuit or microchip that comprises a semiconductor wafer on which a plurality of tiny resistors, capacitors, and/or transistors are fabricated and that can function as an amplifier, oscillator, timer, counter, computer memory, and/or microprocessor. The chip can comprise levels, sometimes referred to as chip levels, basic levels, or in-depth levels, each of which is a structural portion of the chip itself with respect to a chip package (e.g., how a chip is layered with materials and components).

The process flow 100 begins at block 105, where the testing mechanism determines a status of a chip with respect to whether fail signatures indicate a bad chip. The fail signatures can indicate a defect within any portion of a chip. A defect is any physical, structural, or electrical flaw or imperfection of or on the chip. Examples of defects include a raw defect, a scratch, a cluster defect, a lithographic defect, etc.

The status of the chip can indicate an operative condition of the chip. In an embodiment, the status can indicate a good, a defective, or a bad chip. A good status (e.g., good chip) is an integrated circuit with full operability across all circuits of the chip. A defective status (e.g., defective chip) is an integrated circuit with partial operability, as some circuits of the chip may contain defects that prevent operation of that circuit. A bad status (e.g., bad chip) is an integrated circuit with insufficient operability.

To determine that the status of the chip is bad, the testing mechanism can receive, after providing operative input signals to the chip, a combination of signatures that evidence operability or lack thereof. Returning to block 105 of FIG. 1, if a portion of an integrated chip has a defect (as identified by the fail signatures) and that portion is required for normal operations of the chip, then the status of the chip is considered a bad status. If the status of the chip is bad, then the chip is identified as a bad chip and the process flow 100 can end. If, at block 105, the status of the chip is not bad, then the process flow 100 can proceed to block 110, as the chip is likely repairable or includes partial good circuitry.

At block 110, the testing mechanism determines by-level fail probabilities and associated confidence scores. The by-level fail probabilities can include statistical determinations that circuits, which contain defects, are likely to fail due to those defects. Further, the by-level fail probabilities can be statistically determined based on a plurality of signal types received by the testing mechanism during testing of the chip. Examples of signal types include array repair (e.g., required hard repair, required soft repair, optional hard repair, optional soft repair, etc.), logic faults (e.g., scan chain, segment, etc.), and parametric outliners. Confidence scores indicate an agreement level between multiple by-level fail probabilities; thereby a "confidence" regarding a likelihood of circuit and/or chip failures due to defects can be quantified by the confidence scores.

At block 115, the testing mechanism determines whether functionally needed circuitry of the chip intersects with high probability defect areas within the chip. If there is a strong intersection, this may lead to additional testing or disposition of the chip or elements of the chip that may fail but are not currently failing. In an embodiment, the by-level fail probabilities and associated confidence scores can be utilized to identify high probability defect areas within the chip. For instance, as the testing mechanism determines circuits with a probability of failure due to a contained defect, associated confidence scores can be utilized to determine whether that circuit should be included in a high probability defect area. The high probability defect area is thus defined by the testing mechanism, such that the high probability defect area can be a defect and a disposition of near-by circuits. Other examples of a high probability defect area include a circuit that contains a defect, the circuit and adjacent circuits, a quadrant of the chip containing the circuit, a disposition of near-by circuits that are still needed for operations, etc. Once the high probability defect area is determined, the testing mechanism identifies whether the functionally needed circuitry of the chip is included in that high probability defect area.

If, at block 115, the functionally needed circuitry of the chip is included in that high probability defect area, then the process flow 100 can proceed to block 120. At block 120, the testing mechanism determines whether the high probability defect areas can be mitigated. Mitigating a high probability defect areas includes blocking the high probability defect area from operating (e.g., turning the circuit off, thereby preventing use within the chip).

If mitigating is not successful, then the process flow 100 proceeds to block 125. At block 125, the testing mechanism determines a status of the chip. In the case of not mitigating, the status of the chip can be determined as a bad status.

If mitigating is successful, then the process flow 100 proceeds to block 125. At block 125, the testing mechanism determines a status of the chip. In the case of mitigating, the status of the chip can be determined as a defective status or as a chip with a lower quality. Note that lower quality chips (e.g., higher probability of future failure) may be used in certain less critical applications.

If, at block 115, the functionally needed circuitry of the chip is not included in that high probability defect area, then the process flow 100 proceeds to block 125. At block 125, the testing mechanism determines a status of the chip. In the case of the functionally needed circuitry not being included in the high probability defect area, the status of the chip can be determined as a good status.

Figure 2:
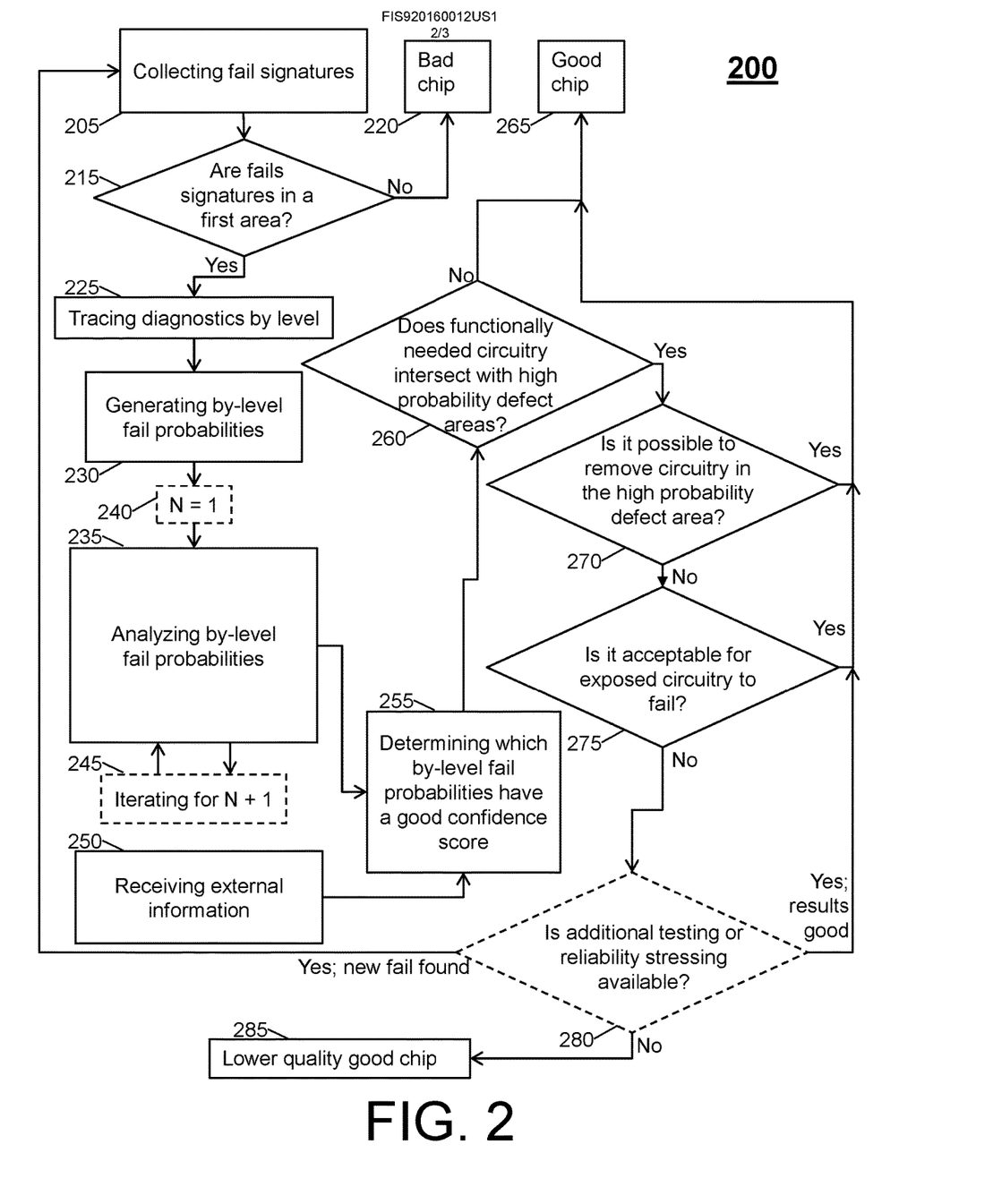
FIG. 2 illustrates a process flow of a system in accordance with an embodiment.

Turning now to FIG. 2, a process flow 200 is generally shown in accordance with an embodiment. The process flow 200 can be implemented by the testing mechanism. The process flow 100 begins at block 205, where the testing mechanism collects fail signatures. The fail signatures can be electrical, visual, and/or statistical signatures derived from an integrated chip. In an embodiment, the integrated chip can have a plurality of cores. For example, the integrated chip can be a complex high reliability chip with four processing cores. Other examples of integrated chips include memory, dynamic random-access memory, and static random-access memory.

At decision block 215, the testing mechanism determines whether the fail signatures are in a first area. The first area, in general, is one or more fixable or partial good areas of the integrated chip. In turn, the testing mechanism determines whether the fail signatures are in the one or more fixable or partial good areas of the integrated chip.

If the fail signatures are not in the first area, the fail signatures are being returned from a second area. The second area, in general, is one or more critical areas of the integrated chip. When the fail signatures are being returned from the second area, the process flow 200 proceeds to block 220, as indicated by the 'No' arrow. At block 220, the testing mechanism determines a status of the chip (e.g., the status of the chip can be determined as a bad status, which is a bad chip).

If the fail signatures are in the first area, the process flow 200 proceeds to block 225, as indicated by the 'Yes' arrow. At block 225, the testing mechanism traces diagnostics by level of the integrated chip. Tracing diagnostics enable the testing mechanism to identify where and on what level defects may exist. At block 230, the testing mechanism generates by-level fail probabilities. Further, the testing mechanism can statistically determine one or more by-level fail probabilities based on the tracing diagnostics. In this way, the testing mechanism detects locations of possible defects and determines if, at those locations, a defect is reliably waiting to happen.

The process flow 200 may then proceed to blocks 235, 240, and 245. As shown in FIG. 2 at block 235, the testing mechanism analyzes by-level fail probabilities. For instance, the testing mechanism can analyze fail probabilities by level for process sensitivities (known to the testing mechanism) and with respect to knowledge of surrounding fails (disposition near by circuits that are still needed for operation). Note that fail probability analysis can incorporate fails found at multiple test levels. Further, fail types can have weights that can be utilized by this analysis (e.g., embedded dynamic random-access memory retention or scan fail weighting). The testing mechanism can perform the analysis through multiple iterations.

In an embodiment, the process flow 200 can iterate through each of the one or more by-level fail probabilities generated in block 230. To perform the iterative analysis, the process flow 200 can utilize blocks 240 and 245, which are shown as optional by each dashed-lined box. For instance, if block 230 generates four by-level fail probabilities. A first of the four by-level fail probabilities (N=1) can be selected at block 240. At block 235, the first of the four by-level fail probabilities is analyzed for known process sensitivities and with respect to knowledge of the remaining three by-level fail probabilities. At block 245, a second of the four by-level fail probabilities (N=1) can be selected. Then, the process flow 200 returns to block 235, where the second of the four by-level fail probabilities is analyzed for known process sensitivities and with respect to knowledge of the first and remaining two by-level fail probabilities. The process flow 200 can then loop through the remaining two by-level fail probabilities. Note that the incrementing of N enables the testing mechanism to look at N different fail mechanisms and whether each of these mechanisms (may or may not) apply to each level. For instance, a circuit can be analyzed once for random defects (N=1), again for scratches (N=2), again for lithographic shorting (N=3), etc.

At block 250, the testing mechanism can receive external information. The external information comprises information on weighting based on knowledge outside of the chip. In an embodiment, the external information can be local to a memory of a discrete computing system (e.g., the processing system 300 of FIG. 3) executing the testing mechanism and/or receive from an source external to the discrete computing system. Further, the weighting can be a weighting of fails influenced by factors, such as if the fails were created by voltage stress, prior knowledge of reliability and test escapes, process knowledge of systematics, by core operating conditions, wafer chip location, yield information of wafer/lot.

At block 255, the testing mechanism determines which by-level fail probabilities have a good confidence score. The testing mechanism can utilize the analysis from block 235 and the external information of block 250 to determine the confidence score, which can then be assigned to the one or more by-level fail probabilities.

At decision block 260, the testing mechanism determines whether functionally needed circuitry of the chip intersects with high probability defect areas within the chip. If, at decision block 260, the functionally needed circuitry of the chip is not included in that high probability defect area, then the process flow 200 proceeds to block 265, as indicated by the 'No' arrow. At block 265, the testing mechanism determines a status of the chip. In the case of the functionally needed circuitry not being included in the high probability defect area, the status of the chip can be determined as a good status, i.e., a good chip. If, at decision block 260, the functionally needed circuitry of the chip is included in that high probability defect area, then the process flow 200 can proceed to decision block 270, as indicated by the 'Yes' arrow.

At decision block 270, the testing mechanism determines whether the high probability defect areas can be mitigated. For instance, the testing mechanism determines if it is possible to remove circuitry in the high probability defect area (e.g., turning off circuitry, thereby preventing use within the chip).

If, at decision block 270, it is possible to remove circuitry in the high probability defect area, then the testing mechanism can remove the circuitry. Returning to the example above, if the integrated chip is a complex high reliability chip with four processing cores, then one of the cores can be removed (e.g., go from 4 to 3 operating cores). IN turn, the defective core will not damage/affect the remaining three cores. Then the process flow 200 proceeds to block 265, as indicated by the 'Yes' arrow. At block 265, the testing mechanism determines a status of the chip. In the case of the functionally needed circuitry not being included in the high probability defect area, the status of the chip can be determined as a good status, i.e., a good chip.

If, at decision block 270, it is not possible to remove circuitry in the high probability defect area, then the process flow 200 can proceed to decision block 275, as indicated by the 'No' arrow.

At decision block 275, the testing mechanism determines a functional importance of the circuitry. For instance, the testing mechanism determines if it is acceptable for exposed circuitry to fail. The testing mechanism can determine if it is acceptable for exposed circuitry to fail according to a reliability availability and serviceability (RAS) scheme. Reliability can be defined as the probability that a system will produce correct outputs up to some given time. Availability can be defined as the probability that a system is operational at a given time. Serviceability can be defined as the simplicity and speed with which a system can be repaired or maintained.

If, at decision block 275, it is acceptable for exposed circuitry to fail, then the process flow 200 proceeds to block 265, as indicated by the 'Yes' arrow. At block 265, the testing mechanism determines a status of the chip. In the case of the functionally needed circuitry not being included in the high probability defect area, the status of the chip can be determined as a good status, i.e., a good chip. If, at decision block 275, it is not acceptable for exposed circuitry to fail, then the process flow 200 can proceed to decision block 280, as indicated by the 'No' arrow. Note that decision block 280 is optional, as shown by the dashed-lined box.

At decision block 280, the testing mechanism determines whether additional testing or reliability stressing is available. For instance, the testing mechanism determines if additional testing or reliability stressing are able to further resolve fail probability of circuitry.

If, at decision block 280, the additional testing or reliability stressing is not available, then the process flow 200 can proceed to block 285, as indicated by the 'No' arrow. At block 285, the testing mechanism determines a status of the chip. In the case of an exposed circuitry failure not being acceptable, the status of the chip can be determined as a defective status, i.e., a lower quality good chip of defective chip.

If, at decision block 280, the additional testing or reliability stressing is available, then the process flow 200 performs the additional testing or reliability stressing.

If the results of the additional testing or reliability stressing are good, then the process flow 200 proceeds to block 265, as indicated by the 'Yes; results good' arrow. At block 265, the testing mechanism determines a status of the chip. In the case of the functionally needed circuitry not being included in the high probability defect area, the status of the chip can be determined as a good status, i.e., a good chip.

If the results of the additional testing or reliability stressing find new defects, new fails, and/or further issues, then the process flow 200 proceeds to block 205, as indicated by the 'Yes; new fail found' arrow. In turn, the testing mechanism can iterate the process flow 200 as needed to resolves the new defects, new fails, and/or further issues.

Figure 3:
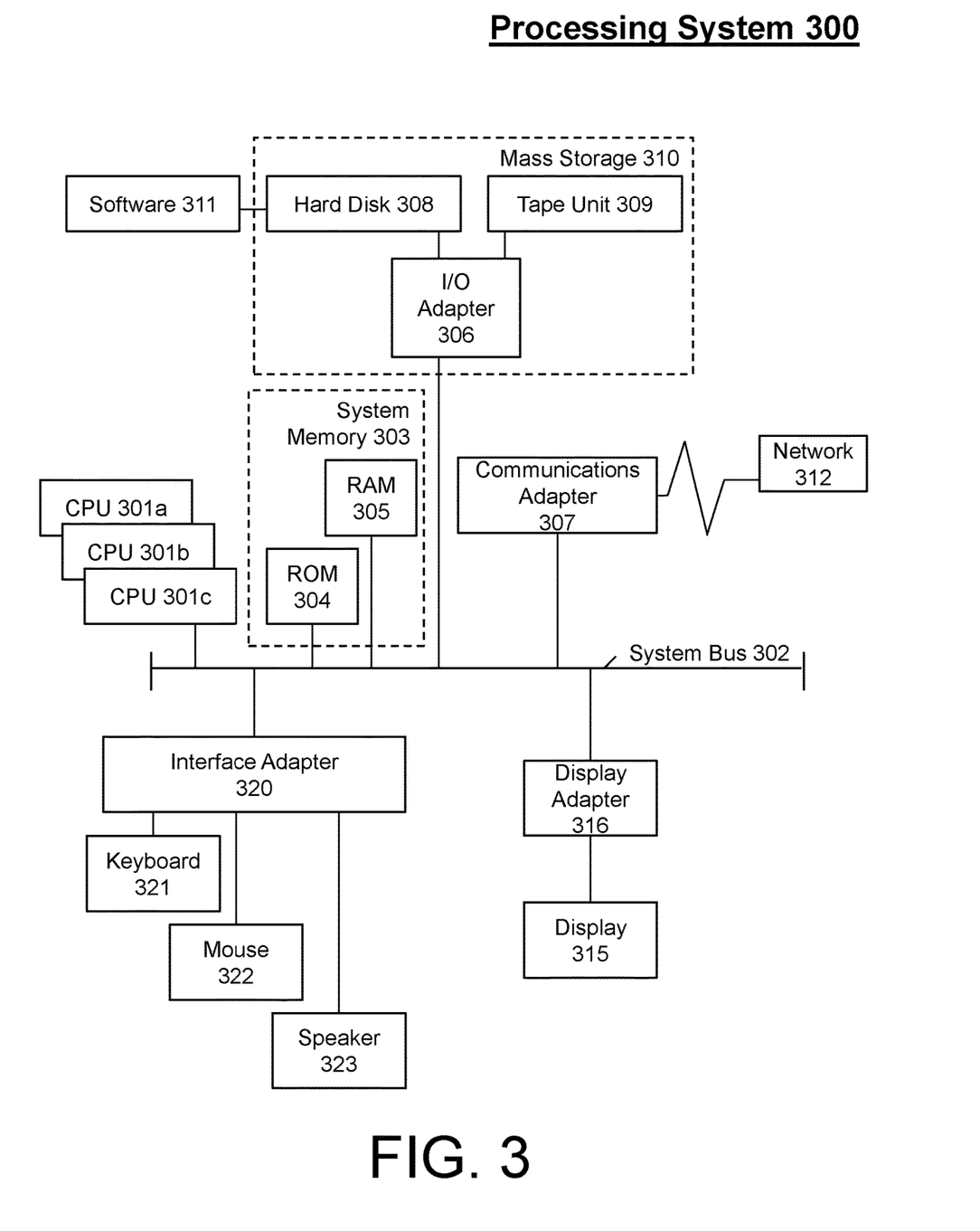
FIG. 3 illustrates a processing system in accordance with an embodiment.

Referring now to FIG. 3, there is shown an embodiment of a processing system 300 for implementing the teachings herein. In this embodiment, the processing system 300 has one or more central processing units (processors) 301a, 301b, 301c, etc. (collectively or generically referred to as processor(s) 301). The processors 301, also referred to as processing circuits, are coupled via a system bus 302 to system memory 303 and various other components. The system memory 303 can include read only memory (ROM) 304 and random access memory (RAM) 305. The ROM 304 is coupled to system bus 302 and may include a basic input/output system (BIOS), which controls certain basic functions of the processing system 300. RAM is read-write memory coupled to system bus 302 for use by processors 301.

FIG. 3 further depicts an input/output (I/O) adapter 306 and a network adapter 307 coupled to the system bus 302. I/O adapter 306 may be a small computer system interface (SCSI) adapter that communicates with a hard disk 308 and/or tape storage drive 309 or any other similar component. I/O adapter 306, hard disk 308, and tape storage drive 309 are collectively referred to herein as mass storage 310. Software 311 for execution on processing system 300 may be stored in mass storage 310. The mass storage 310 is an example of a tangible storage medium readable by the processors 301, where the software 311 is stored as instructions for execution by the processors 301 to perform a method, such as the process flows of FIGS. 1-2. Network adapter 307 interconnects system bus 302 with an outside network 312 enabling processing system 300 to communicate with other such systems. A screen (e.g., a display monitor) 315 is connected to system bus 302 by display adapter 316, which may include a graphics controller to improve the performance of graphics intensive applications and a video controller. In one embodiment, adapters 306, 307, and 316 may be connected to one or more I/O buses that are connected to system bus 302 via an intermediate bus bridge (not shown). Suitable I/O buses for connecting peripheral devices such as hard disk controllers, network adapters, and graphics adapters typically include common protocols, such as the Peripheral Component Interconnect (PCI). Additional input/output devices are shown as connected to system bus 302 via an interface adapter 320 and the display adapter 316. A keyboard 321, mouse 322, and speaker 323 can be interconnected to system bus 302 via interface adapter 320, which may include, for example, a Super I/O chip integrating multiple device adapters into a single integrated circuit.

Thus, as configured in FIG. 3, processing system 300 includes processing capability in the form of processors 301, and, storage capability including system memory 303 and mass storage 310, input means such as keyboard 321 and mouse 322, and output capability including speaker 323 and display 315. In one embodiment, a portion of system memory 303 and mass storage 310 collectively store an operating system, such as the z/OS or AIX operating system from IBM Corporation, to coordinate the functions of the various components shown in FIG. 3.

Technical effects and benefits include resolving integrated chip defects identified during testing of an integrated chip in a probabilistic way that otherwise can not be addressed by conventional mechanisms that test integrated chips. Thus, embodiments described herein are necessarily rooted in testing mechanisms embodied by computer systems to perform proactive operations to overcome problems specifically arising in the realm of integrated chip testing.

Embodiments may include a system, a method, and/or a computer program product at any possible technical detail level of integration. The computer program product may include a computer readable storage medium (or media) having computer readable program instructions thereon for causing a processor to carry out aspects of the embodiments herein.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the embodiments herein may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the embodiments herein.

Aspects of the embodiments are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments herein. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The descriptions of the various embodiments herein have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for determining a status of circuitry within a chip by a testing mechanism, the method comprising:

collecting, by the testing mechanism, fail signatures from portions of the circuitry within the chip to determine the status of the circuitry within a chip, where the fail signatures evidence lack of operability for the portions of the circuitry within the chip;

analyzing, by the testing mechanism, the fail signatures on a by-level basis to identify a high probability defect area within the chip by statistically determining by-level fail probabilities based on a plurality of signal types of the fail signatures, by associating confidence scores with the by-level fail probabilities, and by determining the chip to be a bad chip with respect to whether the by-level fail probabilities and the confidence scores indicate the status of the circuitry to be bad;

determining, by the testing mechanism, whether functionally needed circuitry of the chip intersects with the high probability defect area within the chip; and determining, by the testing mechanism, the status of the circuitry in response to the determining of whether the functionally needed circuitry intersects with the high probability defect area.

2. The method of claim 1, wherein the determining of the by-level fail probabilities comprises statistically determining one or more by-level fail probabilities based on tracing diagnostics of the fail signatures.

3. The method of claim 1, wherein the high probability defect area comprises a defect and a disposition of near-by circuits.

4. The method of claim 1, wherein the testing mechanism determines a mitigation availability of the high probability defect area when the functionally needed circuitry intersects with the high probability defect area.

5. The method of claim 4, wherein the status of the circuitry is determined as a bad status if the high probability defect area cannot be mitigated.

6. The method of claim 4, wherein the status of the circuitry is determined as a defective status if the high probability defect area can be mitigated.

7. The method of claim 1, wherein the testing mechanism determines the status of the circuitry as a good status when the functionally needed circuitry does not intersect with the high probability defect area.

8. The method of claim 1, wherein the chip comprises a semiconductor wafer including one or more levels on which one or more resistors, one or more capacitors, and one or more transistors are fabricated to provide the circuitry, each of the one or more levels being a structural portion of the chip itself.

9. The method of claim 1, wherein the signal types comprise array repair, logic faults, and parametric outliners.

10. The method of claim 1, wherein the confidence score an agreement level between multiple by-level fail probabilities reflecting a likelihood of circuit or chip failures due to defects.

11. A computer program product, the computer program product comprising a computer readable storage medium having program instructions of a testing mechanism for determining a status of circuitry within a chip embodied therewith, the program instructions executable by a processor to cause the processor to perform:

collecting, by the testing mechanism, fail signatures from portions of the circuitry within the chip to determine the status of the circuitry within a chip, where the fail signatures evidence lack of operability for the portions of the circuitry within the chip;

analyzing the fail signatures on a by-level basis to identify a high probability defect area within the chip by statistically determining by-level fail probabilities based on a plurality of signal types of the fail signatures, by associating confidence scores with the by-level fail probabilities, and by determining the chip to be a bad chip with respect to whether the by-level fail probabilities and the confidence scores indicate the status of the circuitry to be bad;

determining whether functionally needed circuitry of the chip intersects with the high probability defect area within the chip; and determining the status of the circuitry in response to the determining of whether the functionally needed circuitry intersects with the high probability defect area.

12. The computer program product of claim 11, wherein the high probability defect area comprises a defect and a disposition of near-by circuits.

13. The computer program product of claim 11, wherein the testing mechanism determines a mitigation availability of the high probability defect area when the functionally needed circuitry intersects with the high probability defect area.

14. The computer program product of claim 11, wherein the testing mechanism determines the status of the circuitry as a good status when the functionally needed circuitry does not intersect with the high probability defect area.

15. A system, comprising a processor and a memory storing program instructions of testing mechanism for determining a status of circuitry within a chip thereon, the program instructions executable by a processor to cause the system to perform:

collecting, by the testing mechanism, fail signatures from portions of the circuitry within the chip to determine the status of the circuitry within a chip, where the fail signatures evidence lack of operability for the portions of the circuitry within the chip;

analyzing the fail signatures on a by-level basis to identify a high probability defect area within the chip by statistically determining by-level fail probabilities based on a plurality of signal types of the fail signatures, by associating confidence scores with the by-level fail probabilities, and by determining the chip to be a bad chip with respect to whether the by-level fail probabilities and the confidence scores indicate the status of the circuitry to be bad;

determining whether functionally needed circuitry of the chip intersects with the high probability defect area within the chip; and determining the status of the circuitry in response to the determining of whether the functionally needed circuitry intersects with the high probability defect area.

16. The system of claim 15, wherein the high probability defect area comprises a defect and a disposition of near-by circuits.

* * * * *